US011768237B2

(12) United States Patent
Tuncer et al.

(10) Patent No.: US 11,768,237 B2
(45) Date of Patent: Sep. 26, 2023

(54) LEAKAGE SCREENING BASED ON USE-CASE POWER PREDICTION

(71) Applicant: Google LLC, Mountain View, CA (US)

(72) Inventors: Emre Tuncer, Santa Cruz, CA (US); Kaushik Balamukundhan, San Jose, CA (US); Yiran Li, Cupertino, CA (US)

(73) Assignee: Google LLC, Mountain View, CA (US)

( * ) Notice: Subject to any disclaimer, the term of this patent is extended or adjusted under 35 U.S.C. 154(b) by 0 days.

(21) Appl. No.: 17/663,060

(22) Filed: May 12, 2022

(65) Prior Publication Data

US 2022/0268835 A1 Aug. 25, 2022

Related U.S. Application Data

(60) Provisional application No. 63/364,487, filed on May 10, 2022.

(51) Int. Cl.
*G01R 31/30* (2006.01)
*G01R 31/3193* (2006.01)

(52) U.S. Cl.
CPC ... *G01R 31/3008* (2013.01); *G01R 31/31935* (2013.01)

(58) Field of Classification Search
CPC .............. G01R 19/257; G01R 31/2884; G01R 31/3004; G01R 31/3181; G01R 31/31813
See application file for complete search history.

(56) References Cited

U.S. PATENT DOCUMENTS

| | | | |
|---|---|---|---|
| 2009/0210201 A1 | 8/2009 | Bickford et al. | |
| 2010/0088660 A1* | 4/2010 | Kim | G01R 31/2623 716/106 |
| 2013/0030730 A1 | 1/2013 | Potknojak | |
| 2013/0113514 A1 | 5/2013 | Anemikos et al. | |
| 2014/0100799 A1 | 4/2014 | Bickford et al. | |
| 2016/0209456 A1* | 7/2016 | Dunnihoo | G01R 31/002 |
| 2018/0068034 A1 | 3/2018 | Zeifman et al. | |
| 2020/0264226 A1 | 8/2020 | Mcmeen et al. | |

(Continued)

FOREIGN PATENT DOCUMENTS

| | | |
|---|---|---|
| CN | 101167251 | 4/2008 |
| CN | 111521952 | 8/2020 |

(Continued)

OTHER PUBLICATIONS

"Foreign Office Action", TW Application No. 111133509, dated May 9, 2023, 9 pages.

*Primary Examiner* — Tung X Nguyen
(74) *Attorney, Agent, or Firm* — Colby Nipper PLLC

(57) ABSTRACT

This document describes techniques and systems for leakage screening based on power prediction. In particular, the described systems and techniques estimate, during a silicon manufacturing process, use-case power (e.g., low power, ambient power, high power, gaming power) to apply leakage screening for apart (e.g., a chip package). In some aspects, measurable silicon parameters (e.g., leakage values, bin values, processor sensor values) may be used for use-case power prediction. Using the described techniques, a maximum allowable predicted use-case power can be determined and used for leakage screening regardless of an individual rail leakage or voltage bin assignment.

7 Claims, 3 Drawing Sheets

(56) References Cited

U.S. PATENT DOCUMENTS

2020/0381556 A1 12/2020 Yamazaki et al.
2021/0372968 A1 12/2021 Denenberg et al.

FOREIGN PATENT DOCUMENTS

| TW | 201911584 | 3/2019 |
| TW | 202034601 | 9/2020 |
| TW | 202139827 | 11/2021 |
| TW | 202213796 | 4/2022 |

* cited by examiner

LEAKAGE SCREENING BASED ON USE-CASE POWER PREDICTION

RELATED APPLICATION

This application claims priority under 35 U.S.C. § 119(e) to U.S. Provisional Patent Application 63/364,487, filed on May 10, 2022, which is incorporated herein by reference in its entirety.

SUMMARY

This document describes techniques and systems for leakage screening based on power prediction. In particular, the described systems and techniques estimate, during a silicon manufacturing process, use-case power (e.g., low power, ambient power, high power, gaming power) to apply leakage screening for a part (e.g., a chip package) based on a multi rail test that tests rails of the chip package in aggregate to determine a final bin for the part. In some aspects, measurable silicon parameters (e.g., leakage values, bin values, processor sensor values) may be used for use-case power prediction. Using the described techniques, a maximum allowable predicted use-case power can be determined and used for leakage screening regardless of an individual rail leakage or voltage bin assignment.

Accordingly, these techniques provide enhanced screening over conventional screening systems that sort parts based on a single, individual rail leakage failing to meet an individual rail threshold limit. Further, although one or more individual rails may fail to meet a leakage threshold, other rails in the chip package may compensate such that in aggregate, the chip package can meet an overall performance level (e.g., global limit such as power or temperature). Also, a part in which its rails each barely pass a conventional screening test may in aggregate exceed the global limit (e.g., an operational temperature threshold) for the part, but such a part is sorted by the leakage screening techniques described herein.

This summary is provided to introduce simplified concepts of leakage screening based on power prediction, which is further described below in the Detailed Description. This summary is not intended to identify essential features of the claimed subject matter, nor is it intended for use in determining the scope of the claimed subject matter.

BRIEF DESCRIPTION OF DRAWINGS

The details of one or more aspects of leakage screening based on power prediction are described in this document with reference to the following drawings. The same numbers are used throughout the drawings to reference like features and components.

DETAILED DESCRIPTION

Overview

This document describes techniques and systems for leakage screening based on power prediction. In particular, the described systems and techniques estimate, during a silicon manufacturing process, use-case power (e.g., low power, ambient power, high power, gaming power) to apply leakage screening for a part (e.g., a chip package) based on a multi-rail test that tests rails of the chip package in aggregate to determine a final bin for the part. In some aspects, measurable silicon parameters (e.g., leakage values, bin values, processor sensor values) may be used for use-case power prediction. Using the described techniques, a maximum allowable predicted use-case power can be determined and used for leakage screening regardless of an individual rail leakage or voltage bin assignment.

Accordingly, these techniques provide enhanced screening over conventional screening systems that sort parts based on a single, individual rail leakage failing to meet an individual rail threshold limit. Further, although one or more individual rails may fail to meet a leakage threshold, other rails in the chip package may compensate such that in aggregate, the chip package can meet an overall performance level (e.g., global limit such as power or temperature). Also, a part in which its rails each barely pass a conventional screening test may in aggregate exceed the global limit (e.g., an operational temperature threshold) for the part, but such a part is sorted by the leakage screening techniques described herein.

In aspects, a method performed by a testing system is disclosed. The method includes receiving a chip package that has been wafer-tested, die-cut, packaged, and binned, where the chip package has a plurality of rails and each rail of the plurality of rails is assigned to a corresponding voltage bin of a plurality of voltage bins based on an adaptive supply voltage value. The method also includes obtaining one or more silicon parameters associated with the chip package, where the one or more silicon parameters are determined during wafer-level testing of the chip package and including at least a leakage current value for each rail. In addition, the method includes performing a multi-rail test on the plurality of rails of the chip package to provide per-rail results across the plurality of voltage bins, where each rail of the plurality of rails is tested based on a corresponding leakage current value and the adaptive supply voltage value of the corresponding voltage bin. Also, the method includes determining, based on an aggregate of the per-rail results across the plurality of voltage bins, an aggregate value. The method further includes categorizing the chip package based on the aggregate value.

While features and concepts of the described techniques for leakage screening based on power prediction can be implemented in any number of different environments, aspects are described in the context of the following examples.

Example Implementations

Figure 1:
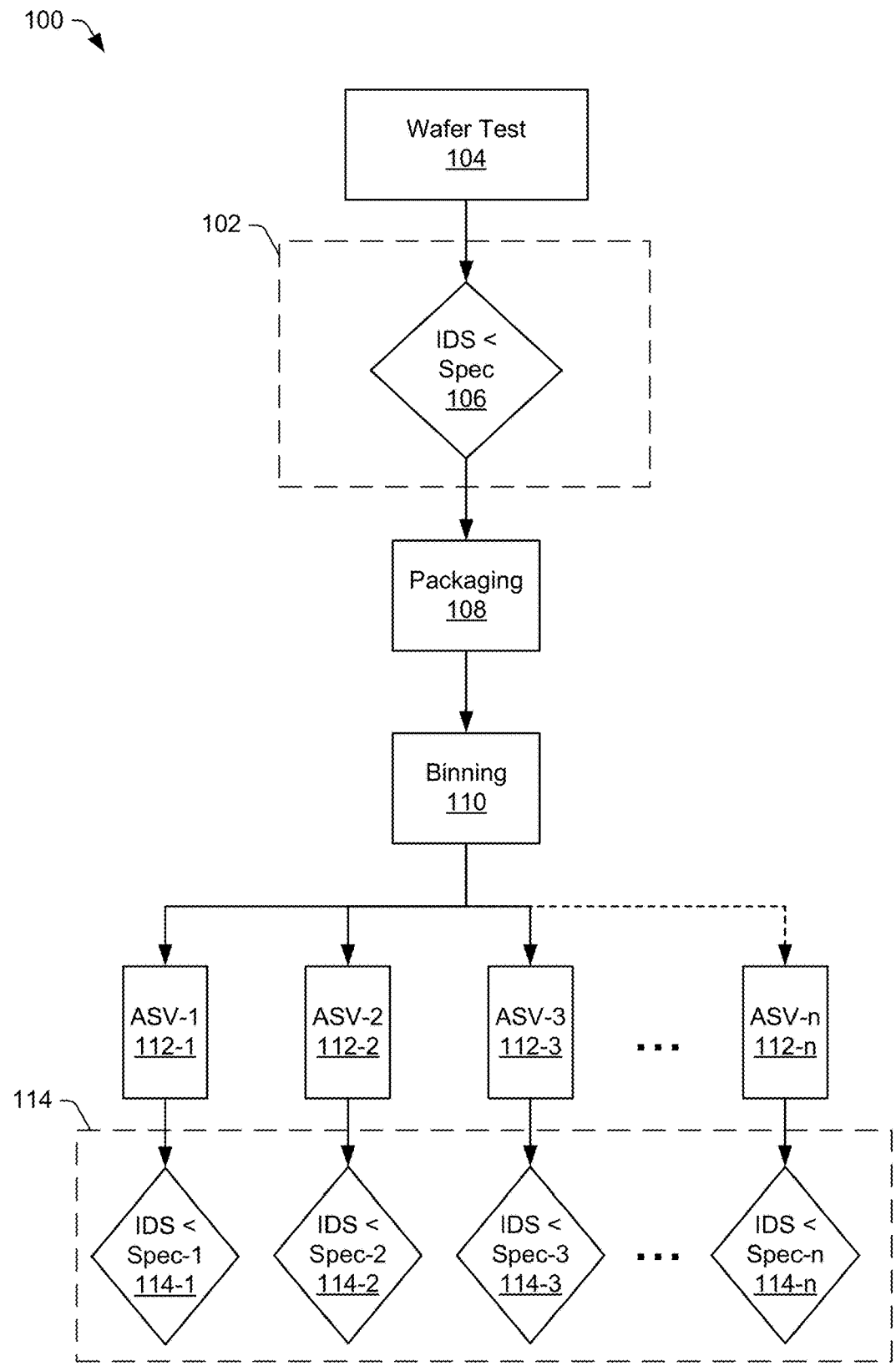
FIG. 1 illustrates an example flowchart of a silicon manufacturing process in accordance with the techniques described herein.

FIG. 1 illustrates an example flowchart 100 of a silicon manufacturing process in accordance with the techniques described herein. During a silicon manufacturing process, leakage screening 102 is performed at the silicon-wafer level. For example, a wafer test 104 is applied to remove highly leaky parts to limit power consumption under different scenarios. Typically, the screening limit is set as the worst-case leakage value predicted during an implementation phase, using worst-case estimations derived from silicon foundry models. Each wafer is tested to determine current leakage values (referred to as current (I) from drain (D) to source (S), IDS) associated with each die on the wafer. Another parameter measured at the wafer level includes adaptive supply voltage (ASV) for each die on the wafer.

At 106, the system determines, for each die on the wafer, whether that die meets specifications based on its corresponding IDS. Dies on the wafer having an associated IDS that meet a corresponding specification threshold are marked as, e.g., "good," and dies having an associated IDS that fails to meet the corresponding specification threshold are marked as, e.g., "bad." Then, the dies are cut out of the wafer. For example, the wafer is cut into a plurality of dies or chips including the marked dies. The dies or chips marked as "bad" may be discarded or recycled. A single chip may include one or more of the dies that are marked "good."

At 108, the good dies or chips are packaged, creating chip packages. Due to variations and imperfections in the silicon manufacturing process, some dies may tend to leak more but can still operate at lower voltage, while other dies may tend to leak less by may require higher voltage for operation. Leakage increases exponentially with voltage.

At 110, voltage binning is applied to the chip packages to determine the minimum voltage to operate the part safely. Generally, faster (and leakier) parts can operate at a lower voltage and slower (and less leaky) parts require higher voltage for operation. When voltage binning is applied, parts can be sorted into bins that each have a unique leakage limit. This is referred to as per bin leakage screening. Generally, during the manufacturing flow, after a part is binned (e.g., the minimum voltage to operate the part safely is determined), a leakage screen based on the assigned bin is applied. In aspects, each supply rail (e.g., voltage domain) of the die(s) in the chip package is assigned a bin value (e.g., bin voltage assignment) based on its corresponding AVS value.

Conventional systems test each supply rail of the chip package at a bin voltage of the bin value assigned to that rail. The chip package is then categorized into different ASV categories 112 (e.g., ASV-1 112-1, ASV-2 112-2, ASV-3 112-3, . . . , ASV-n 112-n). According to conventional screening techniques that use a per ASV-bin leakage screening implemented rail-by-rail, if any single rail fails, the entire part may be downgraded or discarded because it does not meet the specifications. For example, if a single rail fails to meet the bin voltage of its assigned bin, the entire part is moved to a different bin (e.g., with a lower voltage limit) due to that one rail. As additional rails are tested, the part may be downgraded further each time a rail fails the test.

The techniques described herein, however, enable the chip package to be categorized 114 (e.g., sorted) based on testing the rails in aggregate and compared to a single scaled number. For example, a multi-rail test is performed on the rails (e.g., all the supply rails) of the chip package, using the IDS and ASV values obtained at the wafer level, to provide per-rail results across the bins (e.g., all the bins assigned to the rails of the chip package). The per-rail results are input into an aggregate function to determine an aggregate value (e.g., aggregate power value, aggregate temperature value). The aggregate value is then compared to a target metric value (e.g., target power value, target temperature value, global limit) to predict the performance of the chip package relative to a particular metric (e.g., power, temperature).

In an example, the target metric value may be battery life, and the multi-rail test uses the IDS and ASV values of the rails to determine if the part will last, e.g., 23 hours. If the part is a slower part with less leakage, it may last, e.g., 24 hours. Accordingly, in this example, the multi-rail test may accept parts that meet the minimum of 23 hours and reject parts that are lower than 23 hours (e.g., due to being faster and leaking more). In another example, the target metric value may be temperature and the part is for a handheld gaming device. In this case, the multi-rail test can use the IDS and ASV values of the rails in a temperature function to accept parts that do not exceed a temperature limit based on the amount of power output by the part and reject parts that exceed the temperature limit.

Based on the comparison between the aggregate value and the target metric value, the part may be moved to a different bin (e.g., a lower bin, a higher bin) or maintained at the currently assigned bin. Bin-to-bin voltage difference may be any suitable voltage, including a difference of, e.g., 5 millivolt (mV), 10 mV, 20 mV, 25 mV, and so on. In an example, if a central processing unit (CPU) rail for a particular frequency is expected to operate at, e.g., 0.75 mV at a nominal bin (e.g., bin at the center of a distribution), then one bin higher may be at, e.g., 0.7 mV, which may enable the part to operate at a lower voltage to save power, but the part may leak more. Because the part has already passed the leakage screening 102 at the wafer level, the likelihood of the part catastrophically failing is essentially negligible at this point, so it is reasonable to assume that the part is not likely to "fail out" such that the part would need to be discarded. However, the part may be better suited for a different bin but based on the aggregate of the rails rather than a single rail.

The aggregation techniques described herein increase yield over conventional per-rail screening techniques because some rails may compensate for other rails (e.g., one rail may be higher than a leakage limit but may not affect the effective power metric of the chip package). These techniques also reduce the testing time over conventional per-rail screening techniques that test each rail against its own leakage limit because the rails are all tested in an aggregate manner and the aggregate result is compared to a single value.

The flowchart 100 is shown as a set of blocks that specify operations performed but are not necessarily limited to the order or combinations shown for performing the operations by the respective blocks. Further, any of one or more of the operations may be repeated, combined, reorganized, or linked to provide a wide array of additional and/or alternate methods. In portions of the following discussion, reference may be made to the example flowchart 100 of FIG. 1 or to entities or implementations as detailed in FIGS. 2 and 3, reference to which is made for example only. The techniques are not limited to performance by one entity or multiple entities operating on one device. Rather, the set of blocks in the flowchart 100 can be performed by a single device or by multiple different devices. In some implementations, a different device can perform each block of the flowchart 100.

Figure 2:
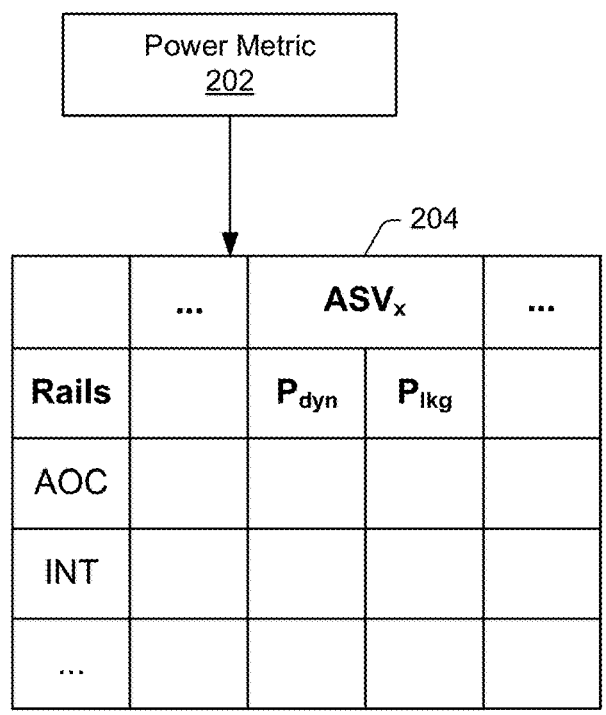
FIG. 2 illustrates an example implementation of per ASV bin leakage targets.

FIG. 2 illustrates an example implementation of per ASV bin leakage targets. In the illustrated example, all the rails of the chip package may be assumed to be assigned to the same bin. An algorithmic model (e.g., a random forest regression model) is used to estimate a use-case power or power limit (e.g., low power, ambient power, high power, gaming power) to apply leakage screening for a part during the silicon manufacturing process. Although the examples herein are described with respect to power, the model may be adapted to estimate any suitable parameter, including power, temperature, battery life, battery brown out, and so on. Accordingly, the model may be adapted to be a power model, a thermal model, a battery life mode, a battery brown out model, and so on. The algorithmic model can be a machine-learned model, a curve-fitting model, or any other suitable model for estimating a desired parameter of a part based on an aggregation of the IDS and ASV values of the rails of the part.

For example, a power metric 202 is projected to an ASV bin (e.g., ASV bin 204). The testing system measures and splits dynamic power (e.g., $P_{dyn}$) and actual leakage power (e.g., $P_{lkg}$) per rail. Leakage is based on target leakage current ($IDS_{TT}$) per rail. A global limit ($P_{limit}$) (also referred to as a target aggregate threshold or power limit) is established for the power metric across all the bins. Then, using the IDS as input, an aggregate value (e.g., aggregate power value) is determined and compared to the global limit $P_{limit}$ using the IDS as input to the algorithmic model, which may be based on the following equation:

$$\sum_{i \in rails} P_{dyn}^i + IDS^i * \frac{P_{lkg}^i}{IDS_{TT}^i} < P_{limit} \quad \text{Equation 1}$$

According to Equation 1, the aggregation of the dynamic power $P_{dyn}$ together with the leakage current IDS multiplied by a factor of the actual leakage power $P_{lkg}$ over the target leakage current $IDS_{TT}$ is compared to the global limit $P_{limit}$ (e.g., power limit) for the part. As shown, Equation 1 is a second-degree polynomial equation derived using the ASV and IDS values of all the rails of a part (e.g., the chip package). For a large dataset (e.g., ~30,000 multi-product semiconductor parts), the model may use the topmost (e.g., top 10, top 25) ASV and IDS features in the dataset. It is noted that Equation 1 (and Equation 2 below) is a combination of a constant term and the sum of linear and square terms (e.g., there are no cross terms). Further, the model may provide a report yield based on a $99^{th}$ percentile limit with predicted days of use (DoU) that is estimated using a graph plotted with predicted versus estimated DoU. Such a model may be implemented for a high-power use-case where thermals are concerned, such as a mobile device without cooling fans.

Figure 3:
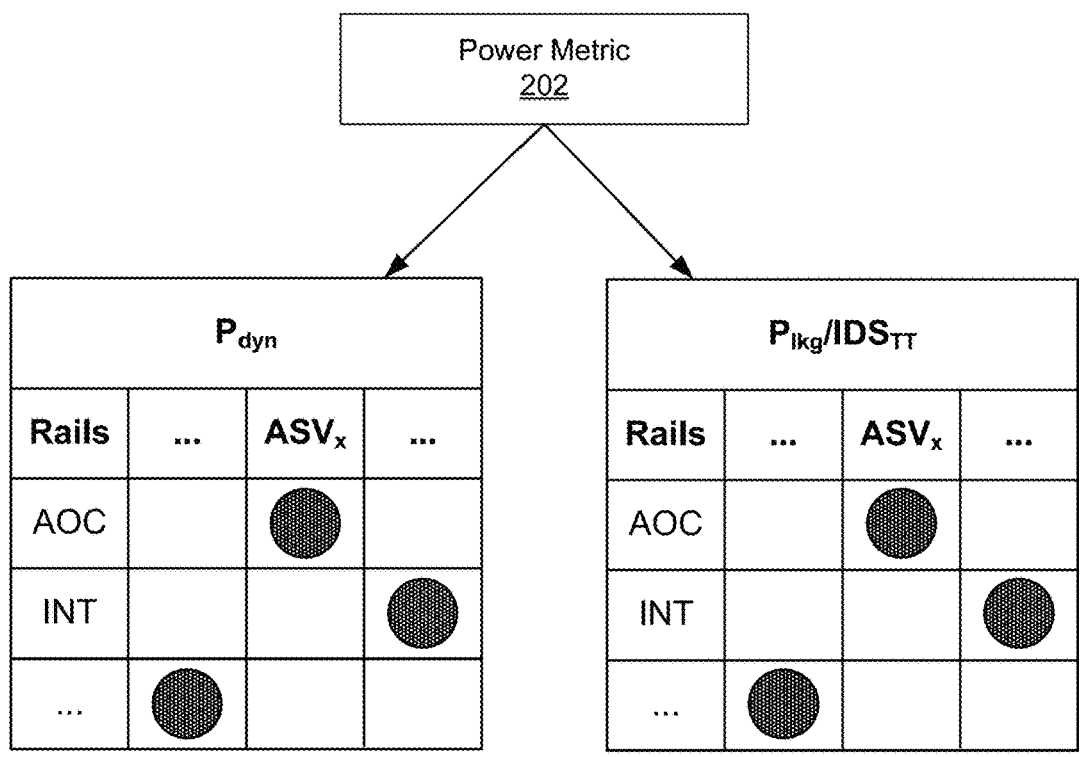
FIG. 3 illustrates an example implementation of per part leakage targets.

FIG. 3 illustrates an example implementation 300 of per part leakage targets. In the illustrated example, one or more rails on a given part may be in a different ASV bin than at least one other rail on the part. In some aspects, each rail on the part may be in a different ASV bin. In such a case, the testing system can select, from different rails, an ASV-bin pair. For this scenario, Equation 1 can be adapted to the following:

$$\sum_{i \in rails, ASV} P_{dyn}^i + IDS^i * \frac{P_{lkg}^i}{IDS_{TT}^i} < P_{limit} \quad \text{Equation 2}$$

The testing system can use Equation 2, for per part leakage targets. The aggregate power of the ASV-bin pairs is compared to the power limit (e.g., global limit $P_{limit}$, target power value) for the part to determine a final bin for the part.

Equations 1 and 2 enable the testing system to predict the power required for operation of a chip package and sort the chip package according to its predicted power. As mentioned, the global limit $P_{limit}$ may be any suitable limit, which corresponds to a particular use-case scenario such as low power, ambient power, high power, gaming power, and so forth.

Although these techniques implement an additional computation at the testing system, these techniques increase accuracy and optimal yield-power trade-off of the silicon manufacturing process compared to that of conventional leakage screening techniques that use per-rail screening. Further, these techniques increase the reliability of the total amount of products produced by the silicon manufacturing process.

In addition, the techniques described herein may be performed by a computing device system having one or more processors and computer-readable storage media (CRM). The processor(s) may include a single-core processor or a multiple-core processor composed of a variety of materials, such as silicon, polysilicon, high-K dielectric, copper, and so on.

The CRM of the system may be a hardware-based storage medium, which does not include transitory signals or carrier waves. As an example, the CRM may include one or more of a read-only memory (ROM), a Flash memory, a dynamic random-access memory (DRAM), a static random-access memory (SRAM), and so on. The CRM includes executable code or instructions of a multi-rail testing manager application. The processor(s) of the computing device (or the testing system) executes the instructions stored in the CRM to direct the operative elements of the computing device (or the testing system) to implement the multi-rail testing manager application for performing the leakage screening based on power prediction.

CONCLUSION

Although implementations for leakage screening based on power prediction have been described in language specific to certain features and/or methods, the subject of the appended claims is not necessarily limited to the specific features or methods described. Rather, the specific features and methods are disclosed as example implementations for leakage screening based on power prediction, and other equivalent features and methods are intended to be within the scope of the appended claims. Further, various different aspects are described, and it is to be appreciated that each described aspect can be implemented independently or in connection with one or more other described aspects. For example, these techniques may be realized using one or more of the entities or components shown in FIGS. 1-3, which may be further divided, combined, and so on. Thus, these figures illustrate some of the many possible systems or apparatuses capable of employing the described techniques.

The invention claimed is:

1. A method for leakage screening based on power prediction, the method comprising:
receiving a chip package that has been wafer-tested, die-cut, packaged, and binned, the chip package having a plurality of rails, each rail of the plurality of rails assigned to a corresponding voltage bin of a plurality of voltage bins based on an adaptive supply voltage value;
obtaining one or more silicon parameters associated with the chip package, the one or more silicon parameters determined during wafer-level testing of the chip package and including at least a leakage current value for each rail;
performing a multi-rail test on the plurality of rails of the chip package to provide per-rail results across the plurality of voltage bins, each rail of the plurality of rails tested based on a corresponding leakage current value and the adaptive supply voltage value of the corresponding voltage bin;
determining, based on an aggregate of the per-rail results across the plurality of voltage bins, an aggregate value; and categorizing the chip package based on the aggregate value.

2. The method of claim 1, wherein categorizing the chip package includes assigning the chip package to a final bin based on the aggregate value.

3. The method of claim 2, wherein at least one of the rails of the plurality of rails does not meet an individual rail threshold associated with the final bin but the aggregate value meets a global limit associated with the final bin.

4. The method of claim 1, wherein:
the aggregate value is an aggregate power value; and
the categorizing of the chip package is based on the aggregate power value in comparison to a target power value.

5. The method of claim 1, wherein the chip package is categorized based on a comparison of the aggregate power value and a target power value.

6. The method of claim 1, further comprising:
testing a wafer to determine the leakage current value;
cutting the wafer into a plurality of dies;
packaging at least one die of the plurality of dies to provide one or more chip packages; and
applying voltage binning to the one or more chip packages to determine an adaptive supply voltage of each rail on the one or more chip packages.

7. The method of claim 1, wherein the method is performed by a processor of a testing system that executes instructions stored in a memory of the testing system.

* * * * *